United States Patent
Miao et al.

(10) Patent No.: US 9,184,198 B1
(45) Date of Patent: Nov. 10, 2015

(54) STACKED IMAGE SENSOR WITH CASCADED OPTICAL EDGE PASS FILTERS

(71) Applicant: Google Inc., Mountain View, CA (US)

(72) Inventors: Xiaoyu Miao, Sunnyvale, CA (US); Anurag Gupta, Los Gatos, CA (US); Roman Lewkow, San Jose, CA (US)

(73) Assignee: Google Inc., Mountain View, CA (US)

( * ) Notice: Subject to any disclaimer, the term of this patent is extended or adjusted under 35 U.S.C. 154(b) by 338 days.

(21) Appl. No.: 13/772,131

(22) Filed: Feb. 20, 2013

(51) Int. Cl.
*H01L 27/00* (2006.01)
*H01L 27/146* (2006.01)
*H01L 31/18* (2006.01)

(52) U.S. Cl.
CPC .......... *H01L 27/14625* (2013.01); *H01L 31/18* (2013.01)

(58) Field of Classification Search
CPC ............ H01L 27/146; H01L 27/14621; H01L 27/14647
USPC ............ 250/208.1, 214.1, 226; 257/431, 440, 257/447; 348/272, 273, 274
See application file for complete search history.

(56) References Cited

U.S. PATENT DOCUMENTS

| | | | |
|---|---|---|---|
| 6,894,265 B2 | 5/2005 | Merrill et al. | |
| 7,947,526 B2 | 5/2011 | Chang | |
| 8,063,465 B2 | 11/2011 | Qian et al. | |
| 2009/0294813 A1* | 12/2009 | Gambino et al. | 257/292 |
| 2010/0157117 A1 | 6/2010 | Wang | |
| 2011/0233702 A1 | 9/2011 | Takahashi et al. | |

OTHER PUBLICATIONS

FOVEON, "Direct Image Sensors", X3 Technology, 2 pages downloaded from the Internet on Jan. 24, 2013 from http://www.foveon.com/article.php?a=67.
FOVEON, "What's a Pixel", X3 Technology, 2 pages downloaded from the Internet on Jan. 24, 2013 from http://www.foveon.com/article.php?a=68.
FOVEON, "Why X3 Is Better", X3 Technology, 2 pages downloaded from the Internet on Jan. 24, 2013 from http://www.foveon.com/article.php?a=69.
FOVEON, "Image Comparison", X3 Technology, 2 pages downloaded from the Internet on Jan. 24, 2013 from http://www.foveon.com/article.php?a=70.
FOVEON, "VPS", X3 Technology, 2 pages downloaded from the Internet on Jan. 24, 2013 from http://www.foveon.com/article.php?a=71.
FOVEON, "Windowing", X3 Technology, 2 pages downloaded from the Internet on Jan. 24, 2013 from http://www.foveon.com/article.php?a=72.

(Continued)

*Primary Examiner* — Kevin Pyo
(74) *Attorney, Agent, or Firm* — Blakely Sokoloff Taylor & Zafman LLP

(57) ABSTRACT

A color sensitive image sensor includes first, second, and third image sensor layers vertically aligned in an image sensor stack. Each of the image sensor layers includes a pixel array oriented to generate image data in response to light incident on the image sensor stack and readout circuitry coupled to the pixel array to readout the image data. A first optical filter layer is disposed between the first image sensor layer and the second image sensor layer and has a first edge pass filter characteristic with a first cutoff wavelength. A second optical filter layer is disposed between the second image sensor layer and the third image sensor layer and has a second edge pass filter characteristic with a second cutoff wavelength offset from the first cutoff wavelength.

14 Claims, 6 Drawing Sheets

(56) References Cited

OTHER PUBLICATIONS

FOVEON, "X3 Fill Light", X3 Technology, 2 pages downloaded from the Internet on Jan. 24, 2013 from http://www.foveon.com/article.php?a=73.

NHK Science & Technology Research Laboratories, "5.1.3 Organic image sensors", NHK STRL, Research Areas, Devices and materials for broadcasting, 2 pages downloaded from the Internet on Jan. 30, 2013 from http://www.nhk.or.jp/strl/english/aboutstrl1/r5-1-3.htm.

Lyon, R. F., "A Brief History of Pixel", Reprint-Paper EI 6069-1, Digital Photography II—Invited Paper IS&T/SPIE Symposium on Electronic Imaging, Jan. 15-19, 2006, San Jose, CA, USA, 16 pages.

Lyon, R. F. et al., "Eyeing the Camera: into the Next Century", Tenth Color Imaging Conference: Color Science and Engineering Systems, Technologies, Applications; Scottsdale, AZ, USA, Nov. 2002, 7 pages.

Hubel, P. M., "Foveon Technology and the Changing Landscape of Digital Cameras", Keyote paper at the Thirteenth IS&T Color Imaging Conference, Scottsdale, AZ, USA, 2005, pp. 314-317.

Guttosch, R. J., "Investigation of Color Aliasing of High Spatial Frequencies and Edges for Bayer-Pattern Sensors and Foveon X3® Direct Image Sensors", 8 pages, downloaded from the Internet on Jan. 24, 2013 from www.foveon.com.

Hubel, P. M. et al., "Spatial Frequency Response of Color Image Sensors: Bayer Color Filters and Foveon X3", Proceedings of SPIE, vol. 5301, EI'04, San Jose, CA, USA, 2004, 4 pages.

Hubel, P. M. et al., "Resolution for Color photography", Electronic Imaging: Digital Photography II, SPIE Proceedings, vol. 6069, San Jose, CA, USA, 2006, 7 pages.

Digital Photography Review, "Fujifilm patents hybrid organic/CMOS sensor", Dec. 21, 2011, 3 pages downloaded from the Internet website dpreview.com.

* cited by examiner

STACKED IMAGE SENSOR WITH CASCADED OPTICAL EDGE PASS FILTERS

TECHNICAL FIELD

This disclosure relates generally to the field of image sensors, and in particular but not exclusively, relates to color-sensing image sensors.

BACKGROUND INFORMATION

Photosensitive regions of a typical silicon-based image sensor (e.g., complementary-metal-oxide-semiconductor ("CMOS") or CCD) are, like panchromatic film, sensitive to all wavelengths in the visual spectrum. While this is sufficient for gray scale image sensors that acquire black-and-white luminance image, color-sensing image sensors require additional optical components to isolate the different spectral bands in the visual spectrum. Such optical components may include a prism that separates the spectral components of visual light or a color filter array ("CFA"), such as a Bayer Pattern CFA, which isolates the color components using pigmented absorption filters. CFAs have become the most dominate color image sensor technology. However, conventional CFAs inherently capture incomplete color samples, which require a demosaicing algorithm to reconstruct the full color image from the incomplete dataset. Demosaicing inherently sacrifices image sharpness and may introduce image artifacts. Since CFAs use pigmented absorptive filters, a significant portions of the incident photons are absorbed in the CFA, thereby lowing the quantum efficiency of the image sensor.

Another technology for implementing color image sensors is referred to as the Foveon vertical color filter image sensor. The Foveon image sensor has three layers of photo-detectors embedded within silicon and stacked vertically to take advantage of the fact that red, green, and blue light are absorbed by silicon at different rates and as result statistically penetrate silicon to different depths. The Foveon image sensor takes advantage of this wavelength to depth penetration relationship to capture full color images at every pixel location of the image sensor. By doing this, the demosaicing process can be avoided, potentially resulting in sharper images. However, the Foveon image sensor suffers from significant spectral overlap between spectral responses of different color photo-detectors within a given multi-pixel stack.

In the Foveon image sensor, the first photo-detector layer absorbs the most blue light signal, a moderate amount of green light signal, and the least amount of red light signal. The second photo-detector layer absorbs a moderate amount of blue light signal, the most green light signal, and a moderate amount of red light signal. The third photo-detector layer absorbs the least amount of blue light signal, a moderate amount of green light signal, and the most red light signal. As such, there is a significant crosstalk between the color signal channels captured at each of the three photo-detector layers. A post-processing color correction matrix is applied against the captured color image data to compensate for the spectral overlap in the responses of the photo-detectors in the three layers. However, this color correction matrix may deteriorate the image quality (e.g., by increasing the noise in the output data).

Organic image sensors are yet another color image sensor technology. Organic image sensors make use of organic photoelectric conversion materials to absorb photons at different wavelengths in each layer and convert these photons into electrons. This technology has yet to mature with current disadvantages including low quantum efficiency, unknown image quality, and issues with high-volume manufacturing and reliability.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

DETAILED DESCRIPTION

Embodiments of an apparatus, system, and method of fabrication for a stacked image sensor with cascaded edge pass filters are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
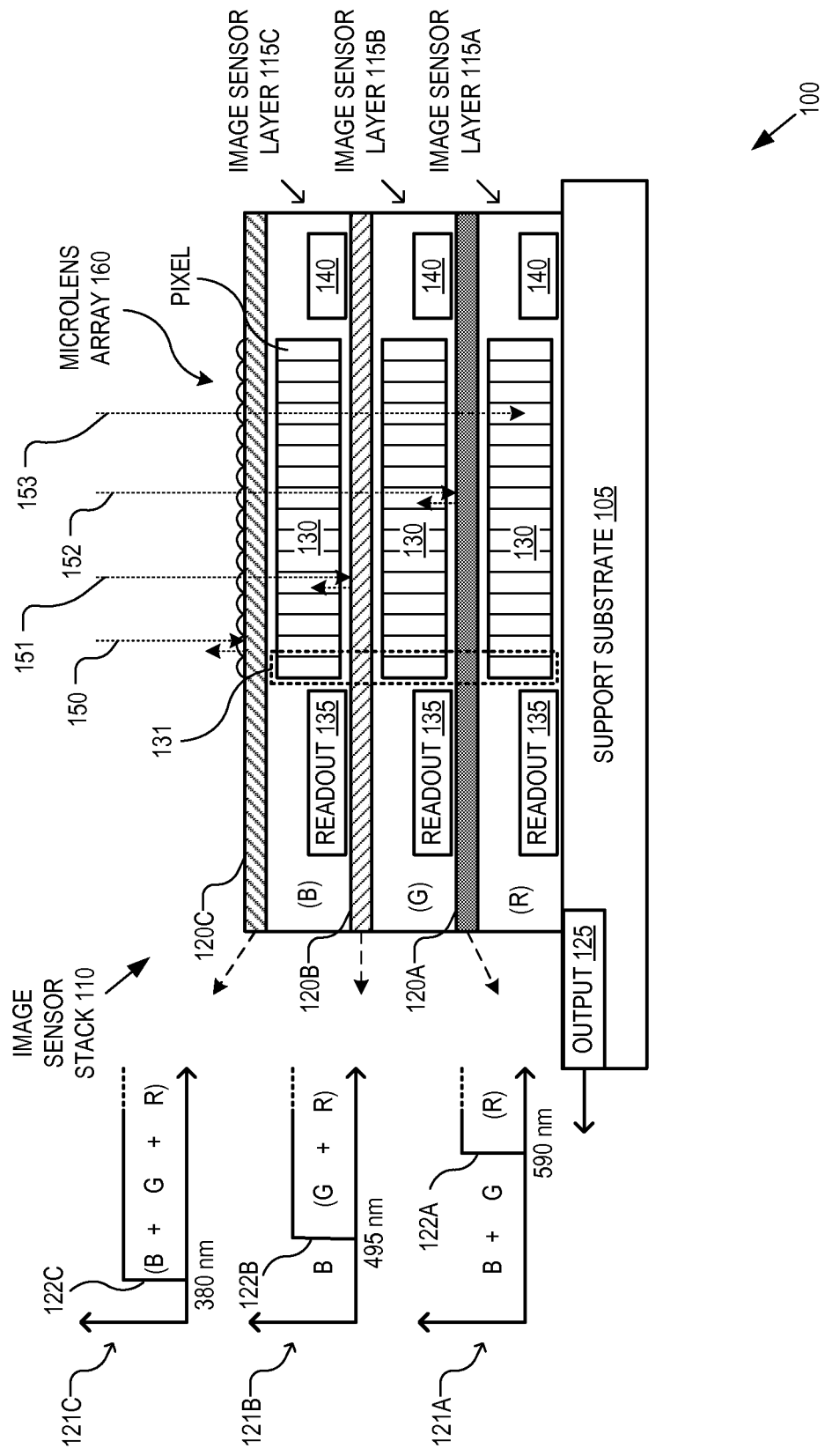
FIG. 1 is a block diagram illustrating an image sensor having cascaded optical edge pass filters, in accordance with an embodiment of the disclosure.

FIG. 1 is a block diagram illustrating a multi-color image sensor 100 having cascaded optical edge pass filters, in accordance with an embodiment of the disclosure. The illustrated embodiment of image sensor 100 includes a support substrate 105, output circuitry 125, and an image sensor stack 110 including image sensor layers 115A, 115B, and 115C (collectively image sensor layers 115), optical filter layers 120A, 120B, and 120C (collective optical filter layers 120). The illustrated embodiment of image sensor layers 115 each includes a pixel array 130, readout circuitry 135, and control circuitry 140.

Multi-color image sensor 100 is a multi-layer vertically stacked image sensor where individual pixels of pixel arrays 130 that align in a vertical column 131 form a single logical sensor pixel. This is in contrast to conventional complementary-metal-oxide-semiconductor ("CMOS") image sensors that use a color filter array ("CFA"), such as a Bayer Pattern CFA, which uses groups of four laterally positioned pixels at a single layer to acquire color image. The image data acquired by each pixel in a logical sensor pixel (or column 131) is logically grouped as a single color image pixel. Image sensor stack 110 enables each image sensor layer 115 to acquire a full resolution image in each spectral band. In other words, each image sensor stack 110 acquires a full resolution sample in each color band, thereby avoiding the need to perform a demosaicing processing.

Silicon has an inherent wavelength to absorption depth dependence, which results in photons having longer wavelengths penetrating deeper into the silicon before being absorbed and creating photo-generated charge carriers. As such, a vertically stacked image sensor has a color band absorption preference at each layer. However, this absorption profile is statistical in nature with no definitive cutoff depths for a given wavelength absorption. This can lead to color cross-talk between the separate image sensor layers.

Accordingly, embodiments of the present disclosure improve color channel isolation between image sensor layers 115 using optical filter layers 120. Embodiments of image sensor 100 utilize optical filter layers 120 to more precisely separate out light into different spectral bands that are sequentially absorbed at the different image sensor layers 115. The illustrated embodiment of optical filter layers 120 each have an edge pass filter characteristic 121 with a different cutoff wavelength 122 that is offset from each other. By cascading cutoff wavelengths 122 in a successively increasing manner with increasing depth into image sensor stack 110, different spectral bands (color bands) are separated out and selectively absorbed in a sequential manner at the different image sensor layers 115.

In the example of a three layer image sensor stack 110 (illustrated) where image sensor layer 115C absorbs blue light, image sensor layer 115B absorbs green light, and image sensor layer 115A absorbs red light, cutoff wavelengths 122C, B, and A may be designed to be approximately 380 nm, 495 nm, and 590 nm, respectively. As illustrated, light 150 with a wavelength shorter than 380 nm is blocked by optical filter layer 120C. Since ambient light has few spectral components that fall substantially below 380 nm, optical filter layer 120C may be omitted in some embodiments. However, light 151 with a wavelength longer than 380 nm is passed through optical filter layer 120C and partially absorbed in the pixel array 130 of image sensor layer 115C. Light 151 with wavelengths shorter than 495 nm is blocked by optical filter layer 120B, while light 152 with wavelengths longer 495 nm is passed and partially absorbed by the pixel array 130 of image sensor layer 115B. Finally, light 152 with wavelengths shorter than 590 nm is blocked by optical filter layer 120A, while light 153 with wavelengths longer than 590 nm is passed and absorbed by the pixel array 130 of image sensor layer 115A.

In this way, the top pixel array 130 absorbs red, green, and blue light, the middle pixel array 130 absorbs red and green light, and the bottom pixel array 130 absorbs only the red light. If image sensor layers 115 are made thin enough, they will preferentially absorb the shorter wavelengths of light passing through them, while allowing most of the longer wavelength light to pass through. As such, top image sensor layer 115C will absorb mainly blue light and middle image sensor layer 115B will absorb mainly green light. Simulation or experiment could be used to determine the ratio of red light absorbed between the three different image sensor layers 115 and the ratio of green light absorbed between the first two image sensor layers 115. These ratios could be used to further improve the reconstruction of a full color image at every pixel column 131 location. Similar to the Foveon sensor, image sensor stack 110 acquires a full color sample at every pixel location. However, unlike the Foven image sensor, by using color filter layers 120 to separate the image sensor layers 115, lower color channel cross-talk can be achieved resulting in an improved image quality.

Example thicknesses for each image sensor layer 115 include 0.5 µm or less for image sensor layer 115C, 1.0 to 1.5 µm for image sensor layer 115B, and 2 µm or more for image sensor layer 115A. Of course, other thicknesses or thickness ranges may be implemented and may be selected based upon the separate spectral bands to be absorbed at each layer. In one embodiment, thicknesses may be selected to achieve an absorption depth in each image sensor layer 115 corresponding to the wavelength being absorbed at a given layer. Of course, the back reflection property of optical filter layers 120 can be exploited to reduce one or more of these thicknesses, as discussed in detail below.

Although FIG. 1 illustrates three image sensor layers 115, it should be appreciated that image sensor stack 110 could be implemented with just two image sensor layers 115 or with more than three image sensor layers 115 to acquire multi-spectral images. Of course, other cutoff wavelengths may be selected than those discussed above in connection with embodiments having three optical filter layers 120 or in connection with embodiments having more or less than three image sensor layers 115.

Figure 5:
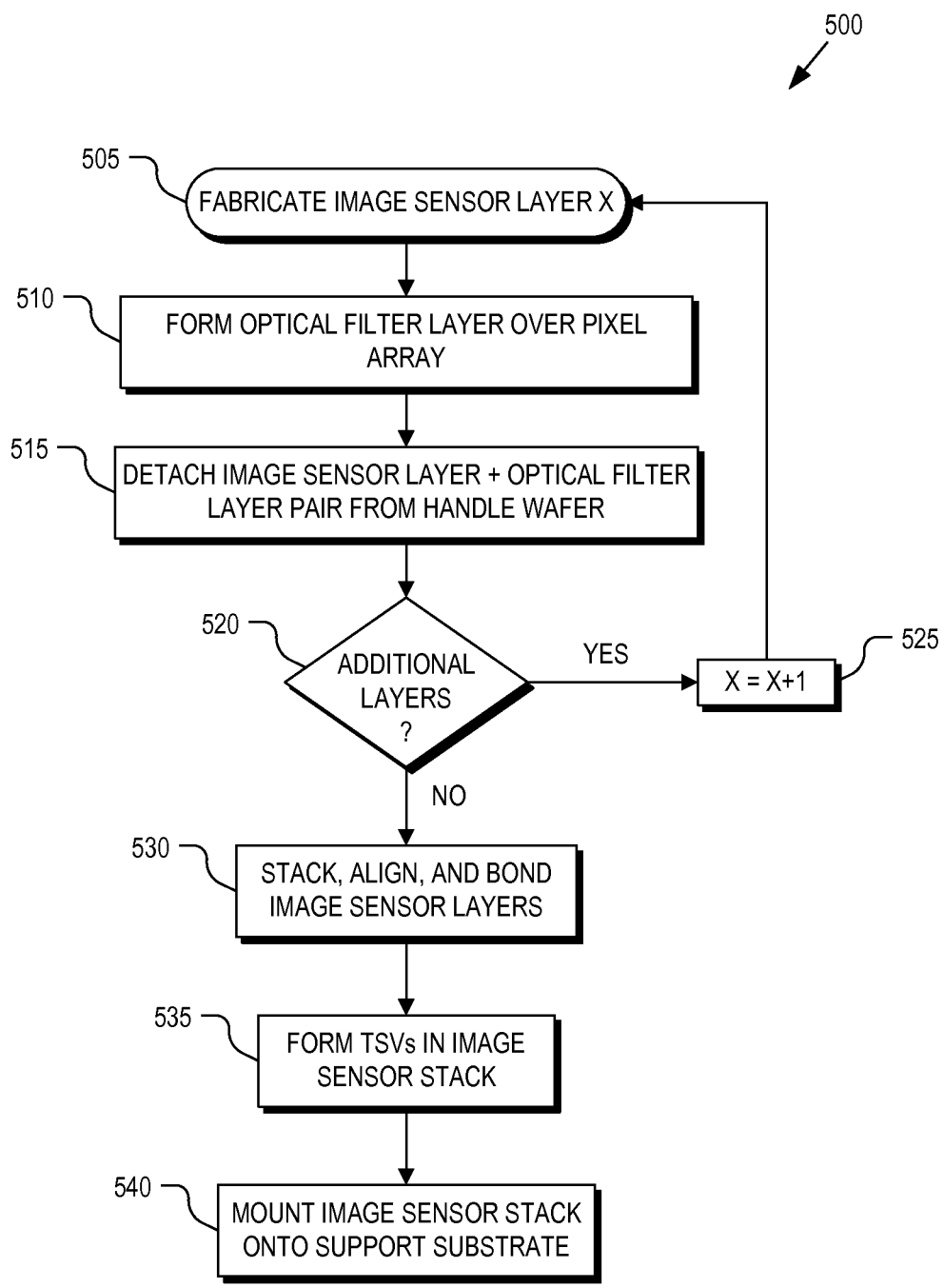
FIG. 5 is a flow chart illustrating a first process of fabricating an image sensor having cascaded optical edge pass filters, in accordance with an embodiment of the disclosure.
Figure 6:
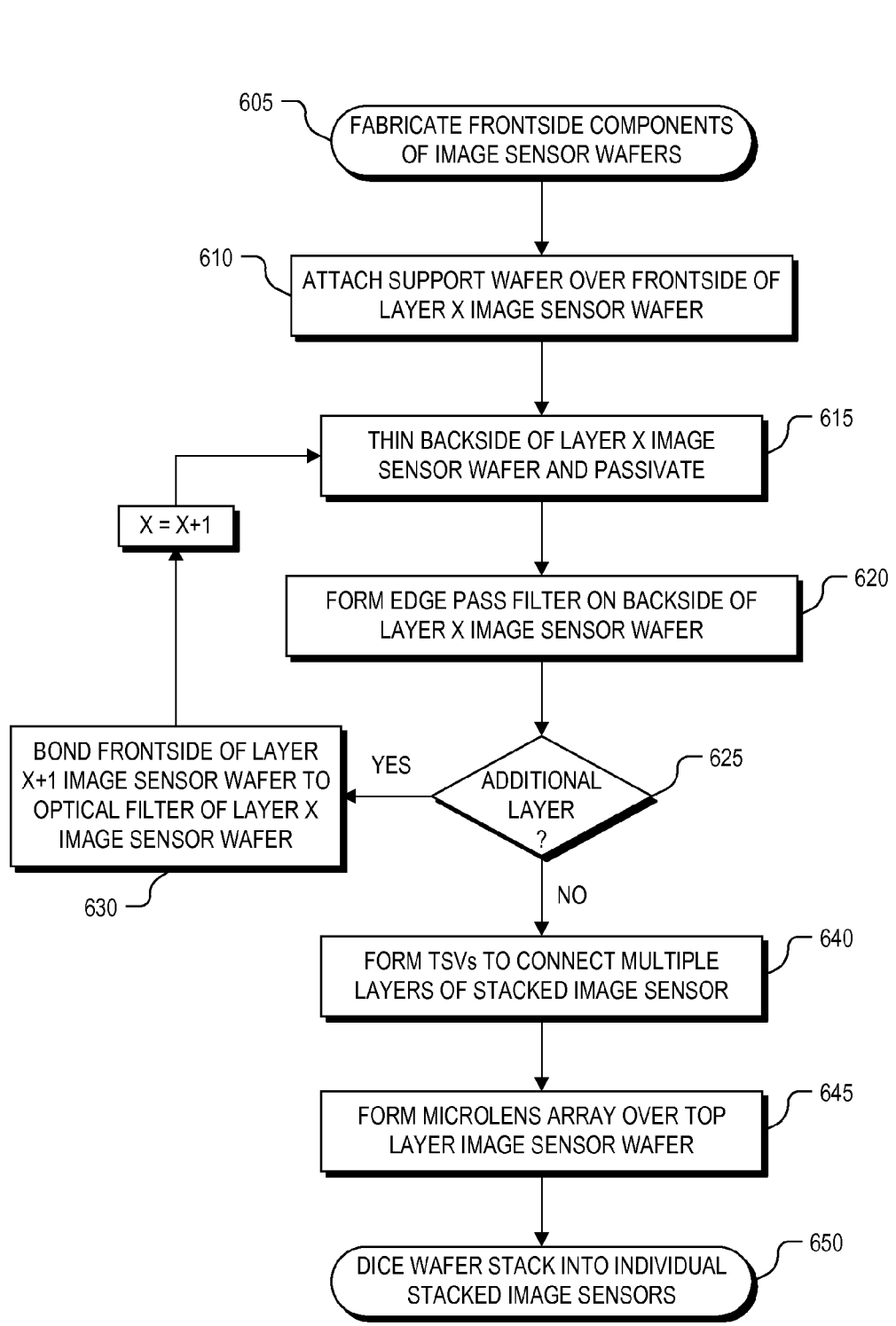
FIG. 6 is a flow chart illustrating a second process of fabricating an image sensor having cascaded optical edge pass filters, in accordance with an embodiment of the disclosure.

Pixel arrays 130 may be implemented as CMOS image sensors, as charged coupled devices ("CCD"), or otherwise. In the case of a CMOS image sensor design, each image sensor layer 115 may be implemented as a backside illuminated ("BSI") image sensor. For a BSI image sensor embodiment, pixel array 130, readout circuitry 135, and control circuitry 140 may be fabricated within an epitaxial silicon layer grown on top of a substrate layer where the backside of the substrate layer is thinned to improve light sensitivity through the backside. FIGS. 5 and 6 illustrate techniques for fabricating image sensor stack 110 using BSI image sensors. In the illustrated embodiment, if image sensor layers 115 are implemented as BSI image sensors, then the backside of each image sensor faces up to receive incident light 150-153, while the frontside, upon which the metal stack for routing signal throughout pixel array 130 is disposed, faces down towards support substrate 105. Support substrate 105 may be a silicon substrate layer, in which output circuitry 125 and signal paths are integrated, a printed circuit board upon which output circuitry and signal paths are disposed, or otherwise.

In order to improve light sensitivity, the illustrated embodiment of image sensor 100 further includes micro-lens array 160 disposed over the top most image sensor layer 115 to direct incident light into the pixel arrays 130. Since the illustrated embodiment includes a top optical filter layer 120C, micro-lens array 160 is disposed over this optical filter layer 120C. In embodiments where top optical filter layer 120C is omitted, micro-lens array 160 may be disposed directly on image sensor layer 115C in optical aligned over pixel array 130.

During operation, control circuitry 140 is coupled to pixel array 130 to control the operation of pixel array 130. For example, control circuitry 140 may issue reset signals, readout signals, etc. to the pixels within pixel array 130. Readout circuitry 135 is coupled to readout the analog image data from pixel array 130 under control of control circuitry 130. Readout circuitry 135 may typically include column readout lines that transfer out a row of analog image data at a time. Readout circuitry 135 may further include amplifier circuitry, analog-to-digital ("ADC") conversion circuitry, memory buffers, double correlated sampling circuitry, serializer circuitry, etc. The readout circuitry 135 at each image sensor layer 115 is further coupled to communicate the image data readout from their respective pixel array 130 to output circuitry 125 in or on support substrate 105.

The image data streams originating from each image sensor layer 115 represents a single color channel carrying color-specific image data captured in a single spectral band. Of course, the image data may include some color cross-talk signal, though this cross-talk signal is substantially reduced by optical filter layers 120, as discussed above. Output circuitry 125 may include memory buffers to temporarily store each color channel of image data associated with a single picture while post image processing is executed. This post image processing may include combining the individual image datasets into a single full color image file, applying cross-talk reduction algorithms to reduce the amount of color cross-talk in the combined full color output image, and may even convert the output image data according to a standardized file format (e.g., jpeg, bitmap, gif, etc.). The image data may also be output as a proprietary, raw, unaltered image file. It should be appreciated that in the various embodiments disclosed here, output circuitry 125 may be omitted and the image data output from the image sensor stack without any post-processing. In other embodiments, readout circuitry 135 at each image sensor layer may perform some post image processing prior to output from the image sensor stack. Accordingly, output circuitry 125 may be omitted or implemented as simple connection ports.

As discussed above, optical filter layers 120 are interposed between image sensor layers 115 to reduce color channel cross-talk. In one embodiment, image sensor layers 115 are implemented as interference filters that are individually designed to have a different cutoff wavelength 122. An example interference filter is a multi-layer dichroic filter film. One beneficial aspect of using interference filters is that the rejected wavelengths that do not pass through the interference filter are reflected (as opposed to pigmented absorption filters used in Bayer Pattern CFAs). This effectively doubles the optical path thickness of each image sensor layer 115 for the reflected wavelengths, thereby increasing the likelihood of photon absorption and increasing the quantum efficiency of image sensor 100. For example, the blue wavelengths of incident light 151 are back reflected off of optical filter layer 120B, thereby traversing the thickness of image sensor layer 115C twice and increasing the likelihood that blue light will be absorbed in image sensor layer 115C. Correspondingly, the green wavelengths of incident light 152 are back reflected off of optical filter layer 120A, thereby traversing the thickness of image sensor layer 115B twice and increasing the likelihood that green light will be absorbed in image sensor layer 115C. In one embodiment, a red wavelength reflector (or simple mirror layer) may be positioned under image sensor layer 115A; however, since image sensor layer 115A is the bottom most layer, this layer can be made thicker to improve longer wavelength (e.g., red) absorption. The reflective properties of interference filters enable one or more of image sensor layers 115 to be designed thinner than they would otherwise be. For example, in one embodiment, the middle image sensor layer 115B is thinner than the bottom image sensor layer 115A. Thus, image sensor layers 115 need not have a uniform thickness; rather, their individual thicknesses may be engineered to optimize absorption in specific spectral bands at each layer. The presence of optical filter layers 115 provides greater flexibility for optimizing these thicknesses.

Figure 2:
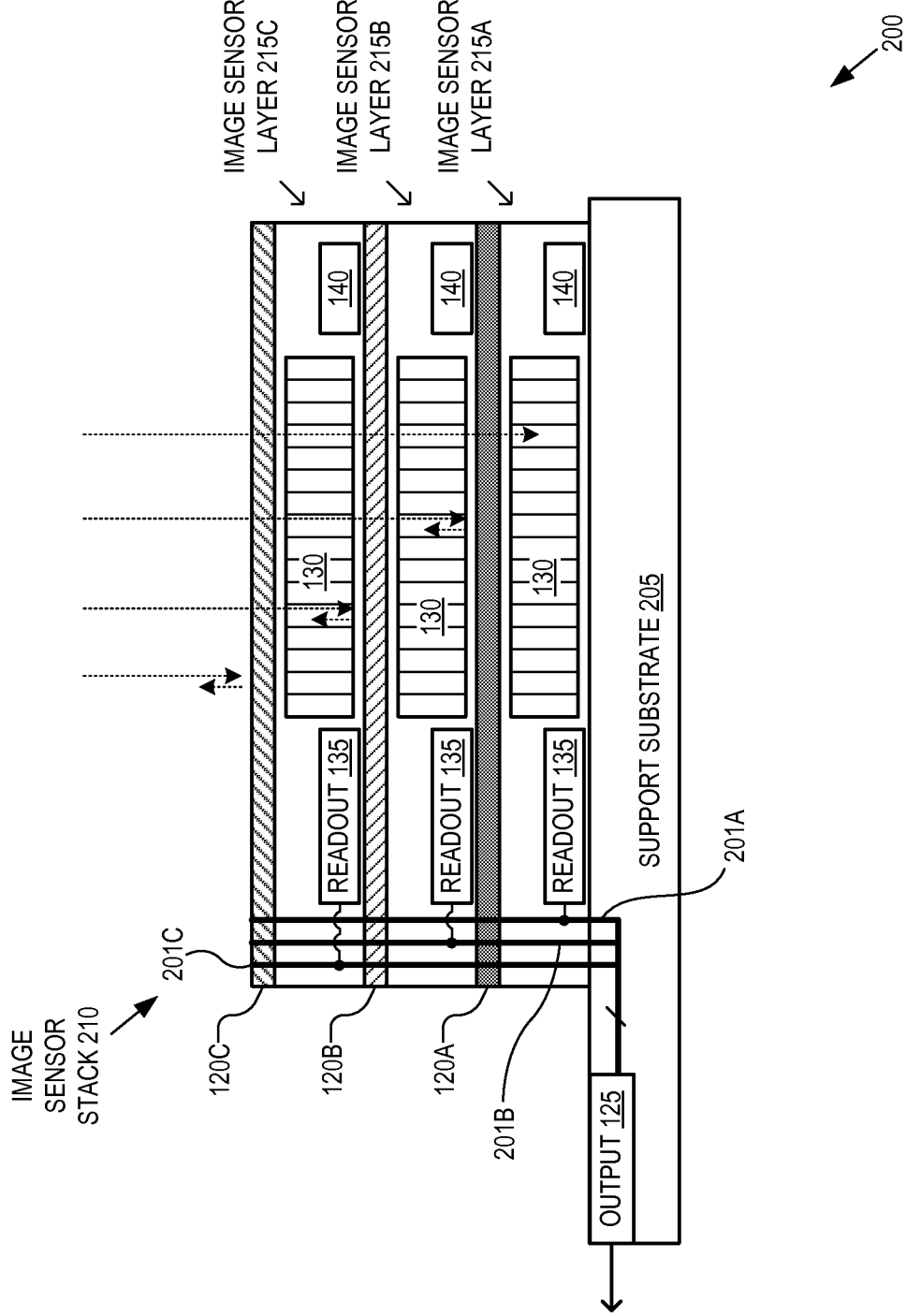
FIG. 2 is a block diagram illustrating an image sensor having cascaded optical edge pass filters and through silicon vias as multi-layer interconnects, in accordance with an embodiment of the disclosure.

FIG. 2 is a block diagram illustrating an image sensor 200 having cascaded optical edge pass filters and through silicon vias as multi-layer interconnects, in accordance with an embodiment of the disclosure. Image sensor 200 represents one possible implementation of image sensor 100 for routing image data, control signals, and/or power between the image sensor layers and the support substrate. The illustrated embodiment of image sensor 200 includes a support substrate 205, output circuitry 125, and an image sensor stack 210 including image sensor layers 215A, 215B, and 215C (collectively image sensor layers 215), optical filter layers 120. The illustrated embodiments of image sensor layers 215 include a pixel array 130, readout circuitry 135, control circuitry 140, and through silicon vias ("TSVs") 201A, B, and C (collectively TSVs 201).

Image sensor 200 is similar to image sensor 100, except that it illustrates one possible interconnect mechanism using TSVs 201. As illustrated, each TSV 201 passes through one or more image sensor layer 215 down to support substrate 205 to deliver power, control signals, and image data there between. In the illustrated embodiment, readout circuitry 135 of each image sensor layer 215 is connected to its only independent signal path to communicate image data to output circuitry 125 independently of each other and in some embodiments in parallel. As discussed below, TSVs 201 may be fabricated once the image sensor layer 215 and optical filter layers 120 have been bonded together to form image sensor stack 210. As such, TSVs 201 pass through one or more optical filter layer 120, and typically will penetrate through the entire image sensor stack 210, as illustrated. Alternatively, the TSV 201 may be fabricated in each paired image sensor layer 215 and optical filter layer 120 before being bonded to the next set of paired layers.

Figure 3:
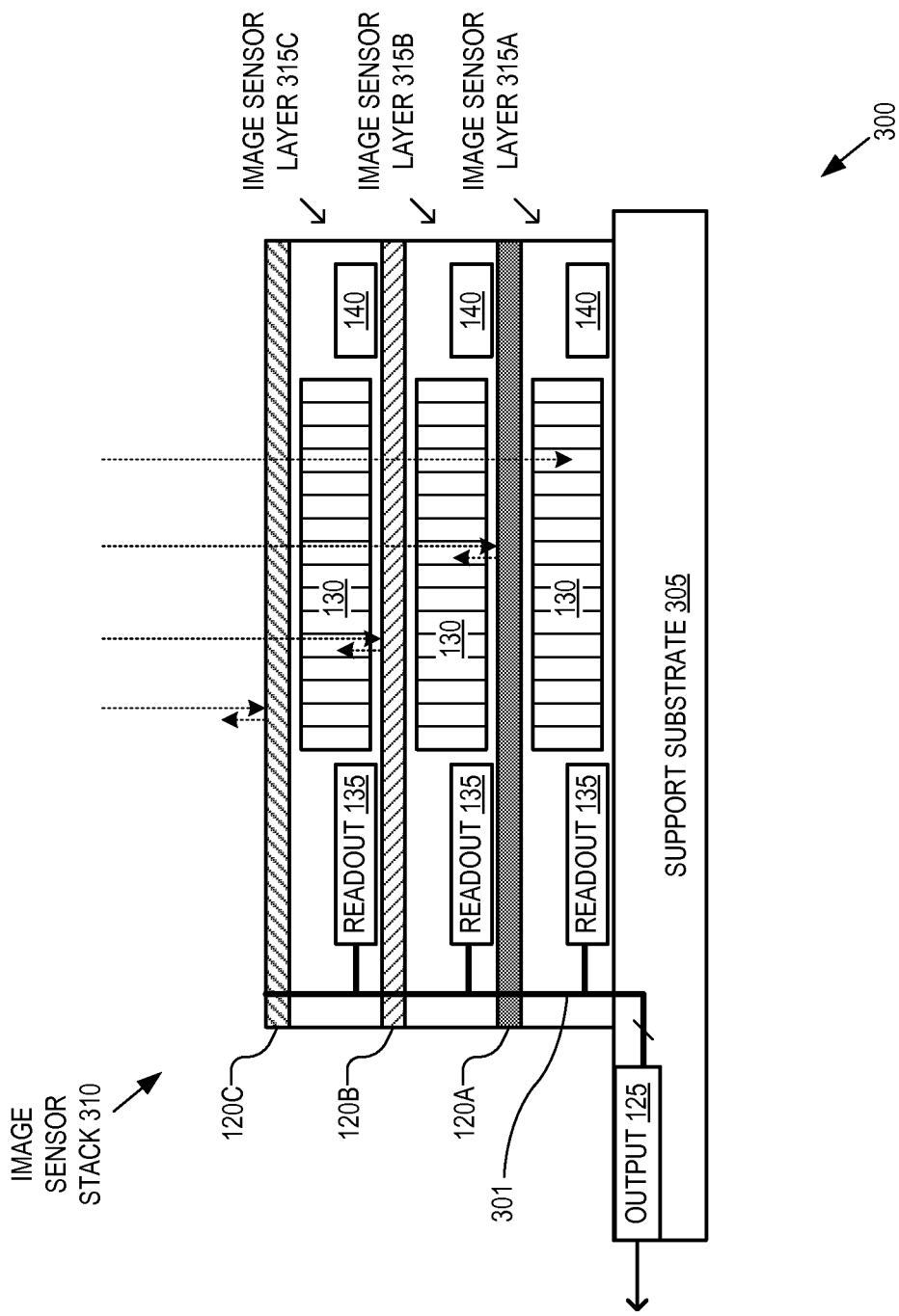
FIG. 3 is a block diagram illustrating an image sensor having cascaded optical edge pass filters and a time-shared through silicon via as a multi-layer interconnect, in accordance with an embodiment of the disclosure.

FIG. 3 is a block diagram illustrating an image sensor 300 having cascaded optical edge pass filters and a time-shared TSV as a multi-layer interconnect, in accordance with an embodiment of the disclosure. Image sensor 300 represents one possible implementation of image sensor 100 for routing image data, control signals, and/or power between the image sensor layers and the support substrate. The illustrated embodiment of image sensor 300 includes a support substrate 305, output circuitry 125, and an image sensor stack 310 including image sensor layers 315A, 315B, and 315C (collectively image sensor layers 315), optical filter layers 120. The illustrated embodiments of image sensor layers 315 include a pixel array 130, readout circuitry 135, control circuitry 140, and a time shared TSV 301.

TSV 301 is coupled to readout circuitry 135 at each image sensor layer 315. Each instance of readout circuitry 135 time shares TSV 301 to communicate its image data to output circuitry 125. Although FIG. 3 illustrates just a single time shared TSV 301, embodiments may include multiple time shared TSV 301 for communicating between image sensor layers 315 and/or with output circuitry 125. Furthermore, image sensor stack 310 may include one or more other TSVs (not illustrated) for delivering power and/or control signals to image sensor layers 315.

Figure 4:
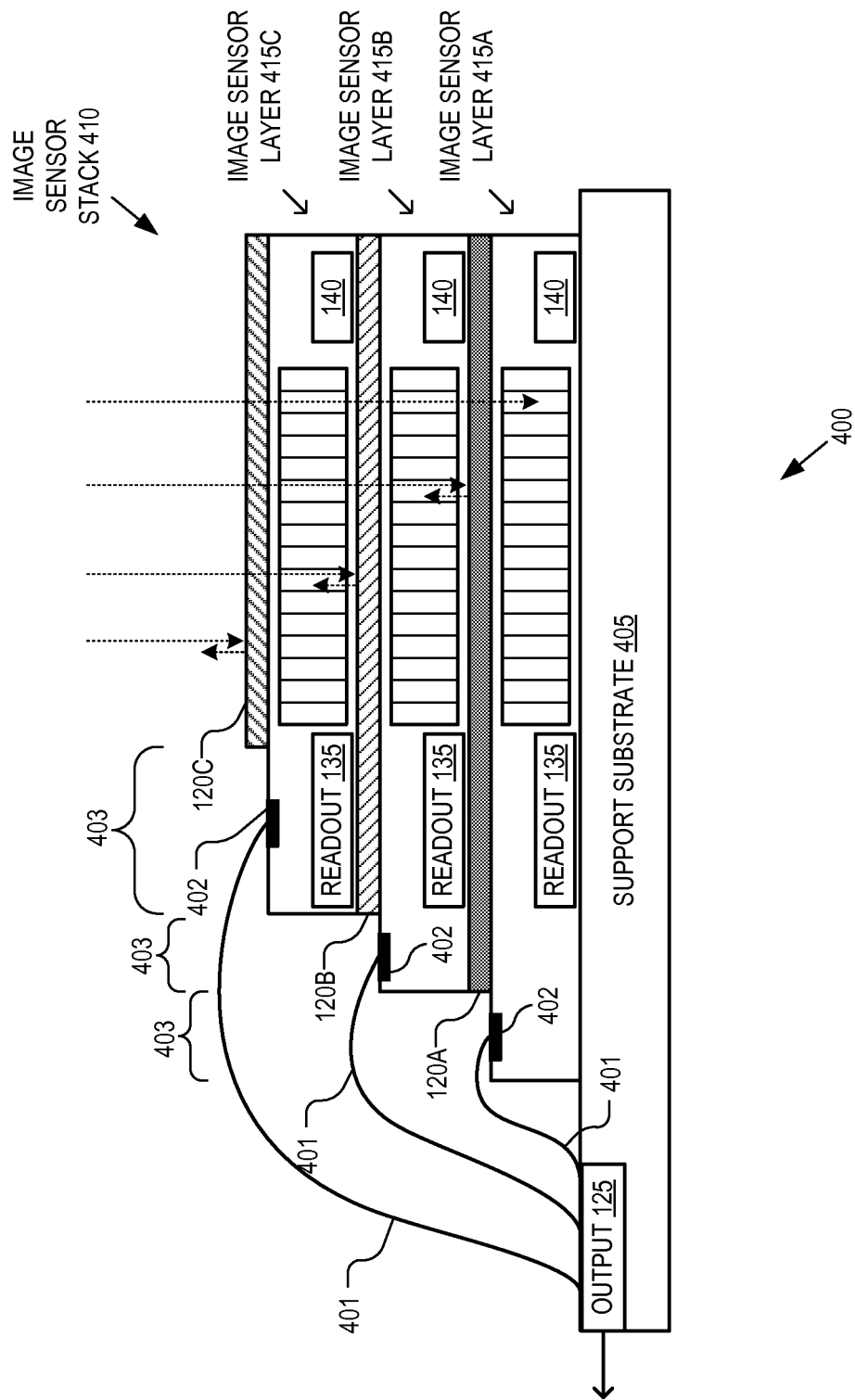
FIG. 4 is a block diagram illustrating an image sensor with a staircase edge profile to accommodate wire bonds for power, input signals, and output image data, in accordance with an embodiment of the disclosure.

FIG. 4 is a block diagram illustrating an image sensor 400 with a staircase profile to accommodate wire bonds for connecting power, control inputs, and output image data lines, in accordance with an embodiment of the disclosure. Image sensor 400 represents one possible implementation of image sensor 100 for routing image data, control signals, and/or power between the image sensor layers and the support substrate. The illustrated embodiment of image sensor 400 includes a support substrate 405, output circuitry 125, wire leads 401, and an image sensor stack 410 including image sensor layers 415A, 415B, and 415C (collectively image sensor layers 415) and optical filter layers 120. The illustrated embodiments of image sensor layers 415 include a pixel array 130, readout circuitry 135, control circuitry 140, and bonding pads 402 disposed on exposed portions 403.

Image sensor stack 410 has a stair step profile shape that provides exposed portions 403 at one or more levels where bonding pads 402 are positioned. Wire leads 401 can then be used to communicate image data, control signals, and/or power to/from each image sensor layer 415. Although FIGS. 2-4 all illustrate TSVs or bonding wires disposed on a single side of the image sensor stack, it should be appreciated that in various other embodiments, one or more TSVs or bonding wires may connect on multiple sides of the image sensor stack.

FIG. 5 is a flow chart illustrating a process 500 for fabricating an embodiment of image sensor 100, in accordance with an embodiment of the disclosure. The order in which some or all of the process blocks appear in process 500 should not be deemed limiting. Rather, one of ordinary skill in the art having the benefit of the present disclosure will understand that some of the process blocks may be executed in a variety of orders not illustrated, or even in parallel.

In a process block 505, the first image sensor layer X in the stack is fabricated. Each image sensor layer 115 is akin to a fully functional image sensor and includes pixel array 130, readout circuitry 135, control circuitry 140, as well as other peripheral circuitry. If each image sensor layer 115 is fabricated as a BSI image sensor, then process block 505 may include fabricating the metal layer stack over the frontside, bonding a handling wafer over the metal stack and thinning the backside substrate layer.

In a process block 510, an optical filter layer 120 is formed over the light sensitive side of the image sensor layer X 115. In an embodiment where the optical filter layer 120 is an interference filter, fabrication of the optical filter layer 120 may entail application of several dielectric layers of variable or alternating refractive indexes and/or thicknesses.

In a process block 515, the temporary handle wafer is detached from the image sensor layer so that the combined image sensor layer and optical filter layer can be bonded to additional image sensor layers. Process 500 iterates at decision block 520 and process block 525 until all additional image sensor layer and optical filter layer pairs are fabricated. Each optical filter layer will be fabricated with a different cutoff wavelength in mind depending upon it position in the image sensor stack.

Once the image sensor layer and optical filter layer pairs are fabricated, they are stacked, aligned, and bonded into image sensor stack 110 (process block 530). The separate layers are aligned to ensure corresponding pixels of a given row and column 131 line up under each other. In one embodiment, a secure bond between a given optical filter layer and the above image sensor layer may be achieved using an interstitial metal bonding layer (not illustrated). For example, prior to bonding a next image sensor layer, a metal layer may be deposited on top of an optical filter layer and patterned to provide bonding points for the frontside metal stack of the next image sensor layer to adhere to. In one embodiment, a grid of trenches may be formed in the optical filter layer and extends down to the underlying substrate layer so that the interstitial metal bonding layer can adhere to the substrate/epitaxial layer and improve bonding strength between image sensor layers.

In a process block 535, TSVs are formed into the image sensor stack 110 to interconnect the signal paths and power lines of the individual image sensor layers 115. Finally, in a process block 540, image sensor stack 110 is mounted onto support substrate 105 with the TSVs connected to signal paths routed in or on support substrate 105. Although not illustrated, process 500 may include additional fabrication steps such as forming a micro-lens array on the top most image sensor layer. Furthermore, if process 500 is tailored for high volume manufacturing, then multiple instances of each image sensor layer may be fabricated on a wafer and diced into individual image sensors.

FIG. 6 is a flow chart illustrating a process 600 for fabricating an embodiment of image sensor 100, in accordance with an embodiment of the disclosure. Process 600 illustrates a technique for fabricating a BSI implementation. The order in which some or all of the process blocks appear in process 600 should not be deemed limiting. Rather, one of ordinary skill in the art having the benefit of the present disclosure will understand that some of the process blocks may be executed in a variety of orders not illustrated, or even in parallel.

In a process block 605, the frontside components of each of the image sensor layers 115 are fabricated. The frontside component includes the pixel arrays 130, readout circuitry 135, control circuitry 140, and the metal stack (not illustrated). These components may be fabricated in high volume by laying out many instances of each component on a wafer.

In a process block 610, a support wafer, which includes many instances of support substrate 105, is bonded over the top side of the bottom layer image sensor wafer fabricated in process block 605. The support wafer is used during the fabrication process as a handle wafer to mechanically hold and manipulate the image sensor wafer bonded thereto. In process block 615, the exposed backside of the bottom layer image sensor wafer is thinned and passivated (e.g., doped layer that is annealed). In process block 620, the first optical filter layer is formed over the thinned backside of the image sensor wafer. If additional image sensor layers 115 are to be added (decision block 625), then the frontside of the next layer image sensor wafer (X+1) is bonded onto the optical filter layer 120 of the current layer image sensor wafer X (process block 630). Process 600 loops until the image sensor stack is fully built up and there are no additional layers to bond (decision block 625).

Once all image sensor wafer layers and optical filter layers have been formed, TSVs are formed into the image sensor stack to interconnect signal paths and power lines within the image sensor wafers (process block 640). In process block 645, microlens array 160 is formed over the top optical filter layer 115 in optical alignment with its underlying pixel array 130. Finally, the wafer stack is diced into individual vertically stacked image sensors 100.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A color sensitive image sensor, comprising:
first, second, and third image sensor layers vertically aligned in an image sensor stack, each of the image sensor layers including:
a pixel array oriented to generate image data in response to light incident on the image sensor stack; and
readout circuitry coupled to the pixel array to readout the image data;
a first optical filter layer disposed between the first image sensor layer and the second image sensor layer, the first optical filter layer having a first edge pass filter characteristic with a first cutoff wavelength;
a second optical filter layer disposed between the second image sensor layer and the third image sensor layer, the second optical filter layer having a second edge pass filter characteristic with a second cutoff wavelength offset from the first cutoff wavelength;
a support substrate providing mechanical support to the image sensor stack; and
output circuitry disposed in or on the support substrate, the output circuitry communicative coupled to receive the image data from the readout circuitry of each of the image sensor layers in the image sensor stack and output the image data from each of the image sensor layers as a combined image.

2. The color sensitive image sensor of claim 1, wherein pixels aligned in a vertical column across the first, second, and third image sensor layers form a single logical sensor pixel and the image data acquired by a single logical sensor pixel is combined to form a single multi-color image pixel.

3. The color sensitive image sensor of claim 1, wherein the image data from each of the image sensor layers comprises an image data subset captured from a different spectral band of light incident on the image sensor stack, and wherein the output circuitry includes:
logic to combine the image data subsets acquired at the different image sensor layers into the combined image having color components from each of the different spectral bands of the light incident on the image sensor stack; and
an output port to output the combined image from the multi-color image sensor.

4. The color sensitive image sensor of claim 1, further comprising:
through silicon vias ("TSVs") extending through at least the first and second image sensor layers to communicatively couple the readout circuitry of each of the image sensor layers to the output circuitry in or on the support substrate.

5. The color sensitive image sensor of claim 4, wherein the each TSV is dedicated to communicate the image data associated with only a single one of the image sensor layers.

6. The color sensitive image sensor of claim 4, wherein at least one of the TSVs is a time shared bus that communicates the image data from each of the image sensor layers to the output circuitry in or on the support substrate.

7. The color sensitive image sensor of claim 6, wherein a profile of the image sensor stack has a stair step shape, the multi-color image sensor further comprising:
bonding pads disposed on exposed portions of each of the image sensor layers; and
wire leads coupling to the bonding pads for communicating the image data from the image sensor stack to the output circuitry on the support substrate.

8. The color sensitive image sensor of claim 1, wherein the first and second optical filter layers are interference filters that pass wavelengths on one side of their respective cutoff wavelengths and reflect wavelengths on an opposite side of their respective cutoff wavelengths.

9. The color sensitive image sensor of claim 8, wherein the image sensor layers of the image sensor stack do not all have a uniform thickness.

10. The color sensitive image sensor of claim 9, wherein a middle layer of the first, second, and third image sensor layers is thinner than a bottom layer and takes advantage of reflective properties of the first optical filter layer to effectively double an absorption thickness for a wavelength band absorbed by the middle layer.

11. The color sensitive image sensor of claim 8, wherein the interference filters comprise a multi-layer dichroic film sandwiched between adjacent image sensor layers.

12. The color sensitive image sensor of claim 1, further comprising:
a third optical filter layer disposed over the third image sensor layer, the third optical filter layer having a third edge pass filter characteristic with a third cutoff wavelength offset from the first and second cutoff wavelengths,
wherein the first, second, and third cutoff wavelengths successively increase or successively decrease with depth into the image sensor stack from a light incident side.

13. The color sensitive image sensor of claim 12, wherein the third cutoff wavelength of the third optical filter layer resides at or below a blue wavelength, the second cutoff wavelength of the second optical filter layer resides between blue and green wavelengths, and the first cutoff wavelength of the first optical filter layer resides between green and red wavelengths.

14. The color sensitive image sensor of claim 1, further comprising:
one or more additional image sensor layers; and
one or more additional optical filter layer having other edge pass filter characteristics with other cutoff wavelengths offset from the first and second cutoff wavelengths.

* * * * *